United States Patent
Ayai (10) Patent No.: US 8,238,991 B2
(45) Date of Patent: Aug. 7, 2012

(54) PRECURSOR WIRE OF OXIDE SUPERCONDUCTING WIRE AND PRODUCTION METHOD THEREOF AND OXIDE SUPERCONDUCTING WIRE PRODUCED BY USING THE PRECURSOR WIRE

(75) Inventor: Naoki Ayai, Osaka (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 13/057,854

(22) PCT Filed: Apr. 22, 2009

(86) PCT No.: PCT/JP2009/058019
§ 371 (c)(1),
(2), (4) Date: Feb. 7, 2011

(87) PCT Pub. No.: WO2010/016302
PCT Pub. Date: Feb. 11, 2010

(65) Prior Publication Data
US 2011/0136673 A1  Jun. 9, 2011

(30) Foreign Application Priority Data
Aug. 5, 2008 (JP) .................. 2008-201681

(51) Int. Cl.
*H01L 39/14* (2006.01)
(52) U.S. Cl. ...................... 505/231; 505/431
(58) Field of Classification Search .................. 505/230, 505/231, 236, 430, 431, 510; 428/397, 373, 428/378, 379, 930
See application file for complete search history.

(56) References Cited

U.S. PATENT DOCUMENTS

| | | | | |
|---|---|---|---|---|
| 5,929,000 A * | 7/1999 | Hahakura et al. | ............. | 505/231 |
| 6,038,462 A * | 3/2000 | Snitchler et al. | ............... | 505/231 |
| 6,253,096 B1 * | 6/2001 | Balachandran et al. | ...... | 505/231 |
| 6,370,405 B1 * | 4/2002 | Riley et al. | ..................... | 505/231 |
| 6,591,120 B1 * | 7/2003 | Tanaka et al. | ................. | 505/231 |
| 6,600,939 B1 * | 7/2003 | Zhao | ............................. | 505/231 |
| 6,957,093 B2 * | 10/2005 | Han | ............................. | 505/231 |
| 7,749,939 B2 * | 7/2010 | Kumakura et al. | ........... | 505/430 |

FOREIGN PATENT DOCUMENTS
CN 101151685 A 3/2008
(Continued)

OTHER PUBLICATIONS

C.H. Rosner et al., "Status of HTS superconducters: Progress in improving transport critical current densities in HTS Bi-2223 tapes and coils", Cryogenics, Apr. 1992, vol. 32, No. 11, pp. 940-948.

*Primary Examiner* — Colleen Dunn
(74) *Attorney, Agent, or Firm* — Drinker Biddle & Reath LLP (57) ABSTRACT

A precursor wire of an oxide superconducting wire includes a first sheath made of silver or silver alloy, a center portion in the first sheath, and a plurality of peripheral segments placed close to one another at the inside of the first sheath so as to surround the center portion. Each of the peripheral segments is formed as a monofilamentary segment that has an arch-shaped cross section and that includes a ribbon-shaped filament made of a precursor of an oxide superconductor and covered with a second sheath made of silver or silver alloy. The multiple peripheral segments are placed in a multilayer state in the form of concentric circles such that wide-width surfaces of the peripheral segments surround the center portion.

14 Claims, 8 Drawing Sheets

FOREIGN PATENT DOCUMENTS

| | | |
|---|---|---|
| JP | 02/207416 | 8/1990 |
| JP | 04-262308 | 9/1992 |
| JP | 05-266726 | 10/1993 |
| JP | 11-039963 | 2/1999 |
| JP | 11-053960 | 2/1999 |
| JP | 2001-118437 | 4/2001 |

* cited by examiner

PRECURSOR WIRE OF OXIDE SUPERCONDUCTING WIRE AND PRODUCTION METHOD THEREOF AND OXIDE SUPERCONDUCTING WIRE PRODUCED BY USING THE PRECURSOR WIRE

TECHNICAL FIELD

The present invention relates to a precursor wire of an oxide superconducting wire, the precursor wire having around its center portion a plurality of peripheral segments each having an arch-shaped cross section, to a production method of the precursor wire, and to an oxide superconducting wire produced by using the precursor wire.

BACKGROUND ART

Usually, an oxide superconducting wire is produced through the powder-in-tube (PIT) method. More specifically, a multifilament oxide superconducting wire having at its inside a plurality of filaments made of oxide superconducting material is produced through the following method. First, a powder composed mainly of a precursor of an oxide superconductor is heat-treated. The powder is filled into a second sheath made of metal. A drawing operation is performed to obtain a monofilamentary wire. A plurality of monofilamentary wires are inserted into a first sheath made of metal. A drawing operation is performed to obtain a multifilamentary wire, which is then subjected to a rolling operation. Finally, the rolled wire is heat-treated to complete the production.

Figure 5:
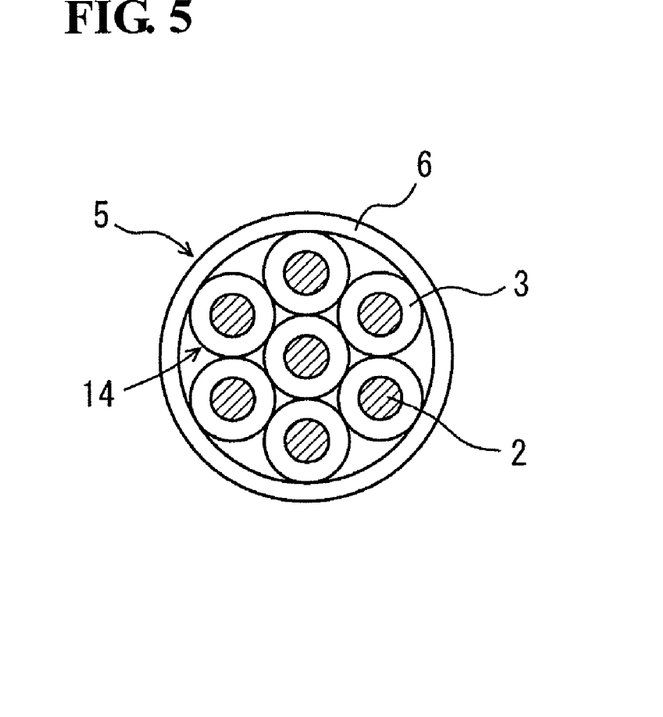
FIG. 5 is a cross-sectional view showing a first example of the structure of a precursor wire of an oxide superconducting wire in the prior art.
Figure 6:
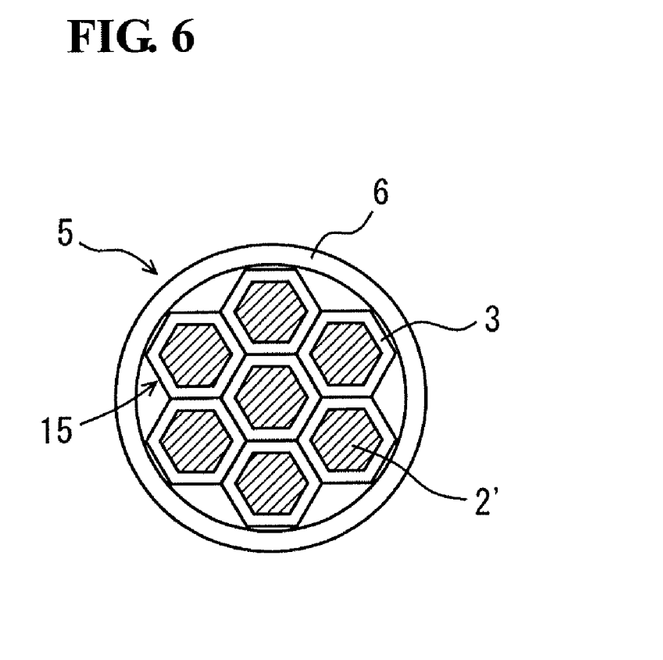
FIG. 6 is a cross-sectional view showing a second example of the structure of a precursor wire of an oxide superconducting wire in the prior art.
Figure 7:
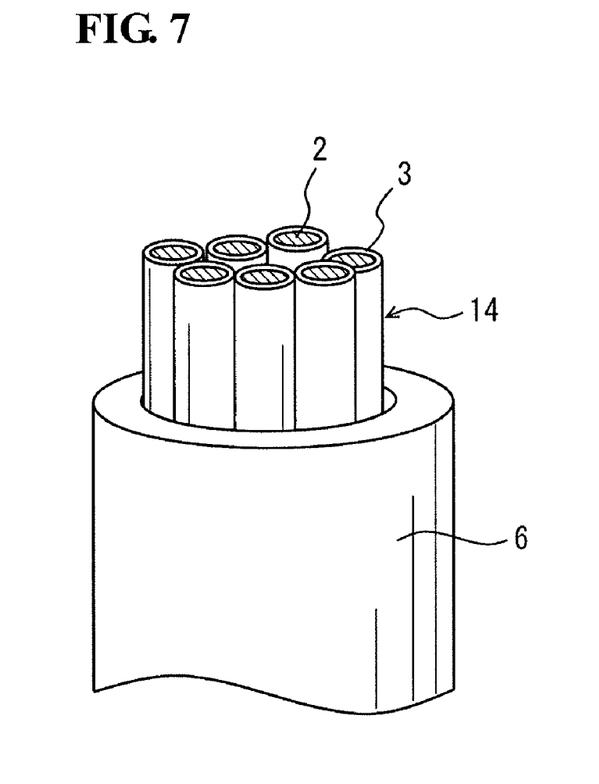
FIG. 7 is a perspective view showing a step of inserting the segments into a sheath in the production process of a precursor wire of an oxide superconducting wire in the prior art.

Generally, the production of an oxide superconducting wire through the PIT method has so far been performed as described below. As shown in FIG. 5, a round monofilamentary wire 14 is produced by covering a filament 2, which has a circular cross section, with a second sheath 3 having the shape of a circular tube. Alternatively, as shown in FIG. 6, a hexagonal monofilamentary wire 15 is produced by covering a filament 2', which has a hexagonal cross section, with a second sheath 3 having the shape of a hexagonal tube. A plurality of round monofilamentary wires 14 or hexagonal monofilamentary wires 15 are inserted into a first sheath 6 (for example, in the case of the filament having a circular cross section, 50 to 200 wires are inserted) (in FIG. 5, to avoid the diagram from becoming complicated, the number of wires is reduced). The first sheath is drawn to produce a precursor wire 5. The precursor wire 5 is rolled and then heat-treated to complete the production of the oxide superconducting wire. FIG. 7 is a diagram showing a step of inserting the predetermined number of round monofilamentary wires 14 into the first sheath 6 in the production process of the precursor wire 5 shown in FIG. 5 described above.

In the oxide superconducting wire produced by using the precursor wire of an oxide superconducting wire shown in FIG. 5 or 6, however, because the cross-sectional shape of the filament is isotropic such as circular or hexagonal, the filament is thick, so that the orientation ability of the crystal of the oxide superconductor cannot be increased. As a result, it has been difficult to offer an oxide superconducting wire having high critical current density.

As the method for increasing the critical current density of an oxide superconducting wire, the following methods have been attempted, for example. A first method provides a core material at the inside of the superconductor (Patent Literature 1). A second method provides a core material having a circular cross section in the center portion, prepares a tape-shaped monofilamentary wire, and attaches the wire longitudinally on the core material such that the entire surface of the wire is brought into intimate contact with the core material (Patent Literature 3). A third method places a plurality of ribbon-shaped filaments in a stabilized matrix having a cross section of a circle or a rotationally symmetric polygon and having a center portion formed with a stiff material (Patent Literature 2).

CITATION LIST

Patent Literature

PTL 1: the published Japanese patent 2844632
PTL 2: the published Japanese patent 3657397
PTL 3: the published Japanese patent 3724128

SUMMARY OF INVENTION

Technical Problem

Despite the above description, it cannot be said that the methods stated in Patent Literatures 1 to 3 described above have satisfactorily met the recent years' requirement of the increasing of the critical current density.

In view of the above-described circumstances, the challenge for the present invention is to offer both a precursor wire of an oxide superconducting wire having a higher critical current density and by extension an oxide superconducting wire.

Solution to Problem

The present inventor has studied on the method for increasing the critical current density as described below to make the present invention.

Figure 8:
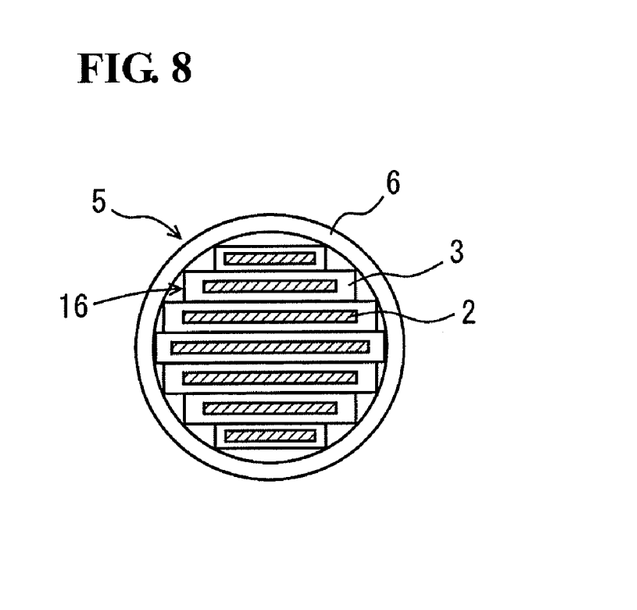
FIG. 8 is a cross-sectional view showing a third example of the structure of a precursor wire of an oxide superconducting wire in the prior art.

First of all, as the method for improving the orientation ability of the crystal, a method of using a thin filament can be conceived. More specifically, for an oxide superconducting wire having a specified diameter, a method can be conceived in which, as shown in FIG. 8, for example, a monofilamentary wire 16 whose filament 2 has a rectangular cross section (hereinafter also referred to as a rectangular monofilamentary wire) is formed and then a plurality of rectangular monofilamentary wires 16 are stacked in layers. As the method for further increasing the effect, a method can be conceived in which, as shown in FIG. 9, the number of rectangular monofilamentary wires 16 is increased to decrease the thickness of the individual wires and then the wires are placed in a multilayer state.

Figure 9:
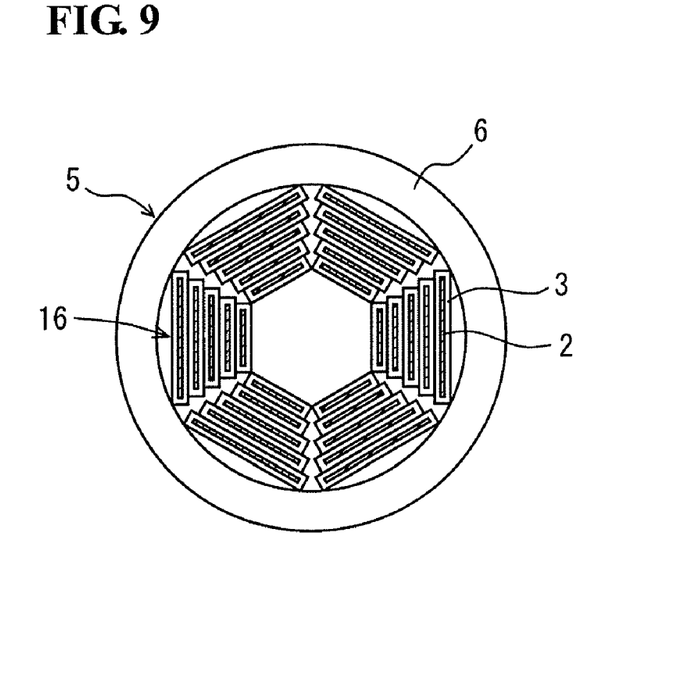
FIG. 9 is a cross-sectional view showing a fourth example of the structure of a precursor wire of an oxide superconducting wire in the prior art.

Nevertheless, it has been found that the structures shown in FIGS. 8 and 9 may create a new problem in that irregularity in the shape is developed in the steps of drawing, diameter reduction, and subsequent rolling for producing the oxide superconducting wire and the irregularity reduces the critical current density obtained after the final heat treatment.

Figure 13:
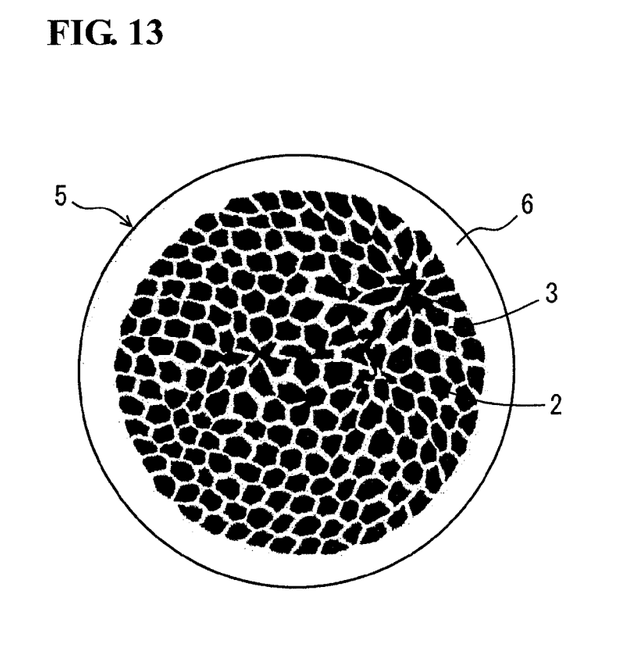
FIG. 13 is a diagram showing the configuration in a cross section of the wire in Comparative example 4 after the wire is drawn.

An example is shown below in which the critical current density was reduced by the step of drawing. The example shown in FIG. 13 is an example in which regular hexagonal monofilamentary wires were used and the number of monofilamentary wires was 211, which was larger than the number used in general. In this example, it was recognized that during the step of drawing, as shown in FIG. 13, the walls of second sheaths 3 were broken and then irregularity in the configuration of the filaments 2 was created. It is likely that the creation of the irregularity caused the reduction in critical current density. The reason why the irregularity was created is considered as described below.

When the number of filaments 2 is increased while the volume ratio of the superconductor is being maintained at a certain value, the wall of the second sheath 3 is thinned inevitably. Consequently, the walls of sheaths are broken during the course of the diameter reduction process, thereby causing the irregularity in the configuration of the filaments.

Even in the case where the rectangular monofilamentary wires are stacked simply in layers as shown in FIGS. 8 and 9, gaps are formed between the monofilamentary wires and between the monofilamentary wire and the first sheath. As a result, it is probable that as with the case described above, the walls of sheaths may be broken and consequently the configuration of the filaments may become irregular at high possibility. On the other hand, when a design is employed in which the sheath has a sufficiently thick wall, the above-described defects can be prevented from developing. However, when the number of monofilamentary wires is increased while the wall of the sheath is being maintained thick, the volume ratio of the oxide superconductors housed in the sheath is decreased, so that the critical current is decreased.

In the drawing operation, a compressive stress is applied through the die from the peripheral surface of the oxide superconducting wire toward the center of the cross section of the oxide superconducting wire. In the actual configuration of the constituting members, the compressive stress is not necessarily applied uniformly to the individual filaments and second sheaths. As a result, at the portion where the compressive stress is concentrated, the walls of sheaths tend to be broken and consequently the configuration is likely to become irregular.

In addition, it is difficult to avoid the remaining of non-superconducting phases such as alkaline earth copper oxides (Ca—Sr—Cu—O) having a diameter of several micrometers in the filaments after the final heat treatment. To prevent the decrease in critical current, it is necessary to provide routes for bypassing the foregoing non-superconducting phases. However, when the number of filaments is increased in the conventional structure or production method to decrease the thickness of the individual filaments, the width is also decreased. As a result, the number of bypassing routes is limited, so that the critical current is decreased.

The present inventor has studied intensely, devised the structure of the precursor of an oxide superconducting wire and the production method, and found a aggregated form (a precursor wire) that has a high critical current density and that does not cause the critical current density to decrease even when the diameter is reduced by the drawing operation. Thus, the present invention has been made.

The first aspect of invention of the present application is a precursor wire of an oxide superconducting wire. The precursor wire includes:

(a) a first sheath made of silver or silver alloy,
(b) a center portion placed at the inside of the first sheath, and
(c) a plurality of peripheral segments placed close to one another at the inside of the first sheath so as to surround the center portion.

Each of the multiple peripheral segments is formed as a monofilamentary segment that has an arch-shaped cross section and that includes a ribbon-shaped filament made of a precursor of an oxide superconductor and covered with a second sheath made of silver or silver alloy. The multiple peripheral segments are placed in a multilayer state in the form of concentric circles such that wide-width surfaces of the peripheral segments surround the center portion.

In the first aspect of invention of the present application, the peripheral segments are each produced by covering a ribbon-shaped filament made of a precursor of an oxide superconductor with a sheath made of silver or the like, are each processed so as to have an arch-shaped cross section, and are placed in the form of concentric circles. Consequently, at the time of the processing for diameter reduction, the diameter reduction is performed while the cross-sectional geometry of the concentric circles is being precisely maintained without losing the shape. As a result, a uniform stress is applied to the wide-width surfaces of the above-described filaments placed so as to surround the center portion. This uniform stress application improves the orientation ability of the crystal of the oxide superconductor. Hence, the present invention can offer a precursor wire of an oxide superconducting wire having high critical current density.

Because when the diameter reduction is performed, a uniform stress is applied to the wide-width surfaces of the filaments, the wall (the silver wall) of the second sheath between the filaments is not broken. From this regard, also, the cross-sectional geometry can be maintained without causing irregularities in the configuration of the filaments.

Because a monofilamentary segment having an arch-shaped cross section is used, unlike the case where a monofilamentary segment having a rectangular cross section is used, at the time the multiple monofilamentary segments are placed in a multilayer state in the form of concentric circles, the gap between the monofilamentary segments can be decreased, so that the packing density of the monofilamentary segments in the first sheath can be increased.

Because a thin ribbon-shaped filament is used before the diameter reduction as the filament made of a precursor of an oxide superconductor, an oxide superconductor having a higher orientation ability of the crystal can be produced.

Because a monofilamentary segment having an arch-shaped cross section that is thin in thickness and wide in width is used as the peripheral segment, even after the drawing and rolling processes, the width of the filament (the length of the long axis in the cross section) can be sufficiently large while the thinness of the thickness of the filament (the length of the short axis in the cross section) necessary to orient the crystal is being maintained. As a result, routes for the electric current to bypass the local defects, such as alkaline earth oxides remaining in the individual filaments, can be secured. Thus, a high critical current density can be obtained.

Conventionally, the crystal orientation is unsatisfactory and high critical current cannot be obtained unless a rolling operation is performed after a multifilamentary structure is obtained. According to the method of the present invention, however, even a round wire can have a comparatively high critical current because by the rolling step of a monofilamentary wire for producing a monofilamentary segment having an arch-shaped cross section, the crystal of the precursor is oriented to a certain extent and the placement in the shape of concentric circles maintains the orientation. In particular, when the wire is to be used in AC, the round wire is twisted at its final size. In this case, when the wire can be used in the form of a round wire, a rolling operation can be omitted, which has conventionally been carried out after the twisting operation. When the rolling operation is omitted, the twist pitch is not elongated. Consequently, a short-pitch twist is maintained, thereby increasing the effect of reducing the AC loss.

Even in a wire having a round cross section before being processed into the shape of a tape, the first aspect of invention of the present application described above can obtain a worked structure in which the ab-planes of, for example, Bi2212 and Bi2201, both of which are precursors of Bi2223, are oriented along the wide-width surface of the filament.

Heat treatment of the round wire can obtain a structure in which the ab-plane of Bi2223 is oriented along the wide-width surface of the filament, so that a good current bypass is formed.

In the foregoing center portion, a segment having a single filament or a bar-shaped segment having no monofilamentary wire may be placed. In addition, in the center portion, one or more segments each having a cross section of a circle or another shape and a different size may be placed.

In the present invention, the terms "concentric circle," "circle," "regular hexagon," and so on are not necessarily limited to geometrically perfect ones. A shape modified to a certain extent within the range that does not deviate from the gist of the present invention is included in the first aspect of invention of the present application.

The second aspect of invention of the present application is the precursor wire of an oxide superconducting wire as defined by the first aspect of invention of the present application and further has the feature described below. In the precursor wire, in the center portion, a monofilamentary segment is placed that has a circular or regular hexagonal cross section and that includes a filament made of a precursor of an oxide superconductor and covered with the second sheath made of silver or silver alloy.

In the second aspect of invention of the present application, in the center portion, a monofilamentary segment is placed, the monofilamentary segment having a circular or regular hexagonal cross section and including a filament made of a precursor of an oxide superconductor. Consequently, the present invention can offer a precursor wire of an oxide superconducting wire having a higher critical current density. In addition, the peripheral segments can be easily placed in the form of concentric circles, and at the time of the diameter-reducing operation in the fitting step, positional deviations of the peripheral segments are less likely to develop.

The third aspect of invention of the present application is the precursor wire of an oxide superconducting wire as defined by the second aspect of invention of the present application and further has the feature described below. In the precursor wire, in the center portion, seven monofilamentary segments are placed each of which has a circular or regular hexagonal cross section and each of which includes a filament made of a precursor of an oxide superconductor and covered with a second sheath made of silver or silver alloy, the seven monofilamentary segments being configured such that six monofilamentary segments are placed close to one another around one monofilamentary segment.

In the third aspect of invention of the present application, in the center portion, seven monofilamentary segments are placed each of which has a circular or regular hexagonal cross section, and the seven monofilamentary segments are configured such that six monofilamentary segments are placed close to one another around one monofilamentary segment. Consequently, the filaments in the center portion, also, are thinned by the rolling operation, so that the orientation is improved and the critical current becomes higher than that obtained when large-diameter segments incorporating large-diameter filaments are used. Furthermore, the effect of the second aspect of invention of the present application can be achieved by using small-diameter monofilamentary segments, which are easy to produce and handle.

The fourth aspect of invention of the present application is the precursor wire of an oxide superconducting wire as defined by any one of the first to third aspects of invention of the present application and further has the feature described below. In the precursor wire, the number of layers of all segments is eight or more, the all segments being composed of the segment or the segments placed in the center portion and the peripheral segments placed in a multilayer state in the form of concentric circles.

In the fourth aspect of invention of the present application, because the number of layers of all segments is eight or more, the thickness of the filaments in the peripheral segments can be sufficiently decreased to increase the orientation ability of the crystal in the filaments. Furthermore, because the peripheral segments are formed by using monofilamentary segments each having an arch-shaped cross section, the width of the peripheral segments in the individual layers can be determined without restriction. Consequently, as described above, while the peripheral segments are becoming sufficiently thin, the width of the segments, that is, the width of the filaments, can be increased, so that the route can be secured for the current to divert a local defect. As a result, the present invention can offer a precursor wire of an oxide superconducting wire that is composed of a small number of segments, that is easy to produce, that is less likely to disturb the configuration of the filaments, and that has high critical current density.

In the fourth aspect of invention of the present application, when one monofilamentary segment is placed in the center portion as in the second aspect of invention of the present application, the number of layers of the monofilamentary segment is regarded as one. Similarly, when in the center portion, six monofilamentary segments are placed around one monofilamentary segment as in the third aspect of invention of the present application, the number of layers of the segments in the center portion is regarded as two. The increase in the number of layers of all segments, which is the summation of the number of layers of the monofilamentary segment or segments placed in the center portion and the number of layers of the peripheral segments, can improve the orientation ability of the crystal in all segments after the rolling process. Thus, the present invention can offer an oxide superconducting wire having a higher critical current density.

The fifth aspect of invention of the present application is the precursor wire of an oxide superconducting wire as defined by any one of the first to fourth aspects of invention of the present application and further has the feature described below. In the precursor wire, the total number of segments is 100 or more.

In the fifth aspect of invention of the present application, because the total number of segments, which is the summation of the number of segments placed in the center portion and the number of peripheral segments, is 100 or more, the filaments of both the segments placed in the center portion and the peripheral segments become sufficiently thin. Consequently, the orientation ability of the crystal in the filaments can be sufficiently increased. Furthermore, because the structure is devised as described above, the second sheath between the filaments is free from breakage. As a result, the present invention can offer a precursor wire of an oxide superconducting wire having a higher critical current density.

The ratio between the number of segments placed in the center portion and the number of peripheral segments is determined as appropriate in consideration of the required property of the oxide superconducting wire.

The sixth aspect of invention of the present application is a method of producing the precursor wire of an oxide superconducting wire as defined by any one of the first to fifth aspects of invention of the present application. The method includes:
  (a) a peripheral segment-producing step for producing a peripheral segment formed as a monofilamentary segment that has an arch-shaped cross section and that includes a ribbon-shaped filament made of a precursor of an oxide superconductor and covered with a second sheath made of silver or silver alloy, (b) a peripheral segment-placing step for placing, in a first sheath made of silver or silver alloy, a plurality of peripheral segments described above around the center portion in a multilayer state in the form of concentric circles such that the wide-width surfaces surround the center portion, and (c) a peripheral segment-fitting step for closely fitting the multiple peripheral segments by drawing the first sheath.

The sixth aspect of invention of the present application renders it possible to produce effectively with a few steps both the precursor wires of oxide superconducting wires having high critical current density, the precursor wires being defined by the first to fifth aspects of inventions of the present application, and by extension the oxide superconducting wires.

The seventh aspect of invention of the present application is the method of producing the precursor wire of an oxide superconducting wire as defined by the sixth aspect of invention of the present application and further has the feature described below. In the method, the peripheral segment-producing step includes:

(a) a circular monofilamentary segment-producing step for producing a circular monofilamentary segment that has a circular cross section and that includes a filament made of a precursor of an oxide superconductor and covered with a second sheath made of silver or silver alloy, (b) a rolling step for rolling the circular monofilamentary segment produced in the circular monofilamentary segment-producing step, and (c) a drawing step for drawing the circular monofilamentary segment rolled in the rolling step by using a specially formed die having a specified shape to obtain an arch-shaped cross section.

In the seventh aspect of invention of the present application, first, a circular monofilamentary segment having a circular cross section is produced (the segment is easy to produce). After being rolled, the segment undergoes a drawing operation using a specially formed die. Thus, a monofilamentary segment having an arch-shaped cross section is produced. Consequently, the peripheral segment can be produced easily.

The eighth aspect of invention of the present application is an oxide superconducting wire that is produced by drawing the precursor wire of an oxide superconducting wire as defined by any one of the first to fifth aspects of invention of the present application and then by heat-treating the drawn precursor wire.

The eighth aspect of invention of the present application renders it possible to offer an oxide superconducting wire that notably exhibits the effect of the present invention that the orientation ability of the crystal of the oxide superconductor is increased and that the route for bypassing the electric current is not limited. Thus, the invention can offer an oxide superconducting wire having high critical current density.

The ninth aspect of invention of the present application is the oxide superconducting wire as defined by the eighth aspect of invention of the present application and further has the feature described below. The wire is produced by drawing the precursor wire of an oxide superconducting wire such that the precursor wire is formed so as to have a cross section of an isotropic shape and then by heat-treating the drawn precursor wire.

In the ninth aspect of invention of the present application, a precursor wire, in which ribbon-shaped filaments are placed in the form of concentric circles that surround the center portion, is drawn so as to have an isotropic shape. Consequently, for example, in the case of Bi-2223, a structure is obtained in which the ab-plane is oriented along the wide-width surface of the filament. Hence, a good current path can be formed. In addition, the invention can offer an oxide superconducting wire having no anisotropy in the critical current density with respect to an external magnetic field. Furthermore, in the case of an oxide superconducting wire that undergoes a twisting operation, a rolling operation is not performed after the twisting operation. Accordingly, in comparison with the wire that undergoes a rolling operation such as a tape-shaped oxide superconducting wire, the twist pitch can be decreased, so that the AC loss can be further decreased.

In the above description, the term "isotropic cross section" means a cross section having the shape of a circle, a regular polygon such as a regular hexagon or regular octagon, or the like.

In the case where the wire is finished as a round wire, in order to decrease the thickness of the filament, it is desirable to increase the number of filaments in comparison with the case of a tape-shaped wire or to process the wire until it has a smaller size as the finished wire.

The tenth aspect of invention of the present application is the oxide superconducting wire as defined by the eighth aspect of invention of the present application and further has the feature described below. The wire is produced by drawing the precursor wire of an oxide superconducting wire, then by rolling the drawn precursor wire such that it has the shape of a tape, and then by heat-treating the rolled precursor wire.

In the tenth aspect of invention of the present application, because the wire is rolled so as to have the shape of a tape before it is heat-treated, filaments each having a high aspect ratio are packed with high density. Thus, the invention can offer an oxide superconducting wire having high critical current density.

For example, when a precursor wire of an oxide superconducting wire having a cross section with a diameter of 1.5 mm is processed to a tape-shaped wire having a thickness of 0.2 mm and a width of 4 mm or so, uniform filaments each having a thickness of about 5 μm and a width of 200 to 300 μm can be obtained.

The eleventh aspect of invention of the present application is the oxide superconducting wire as defined by any one of the eighth to tenth aspects of invention of the present application and further has the feature described below. The wire is a Bi-based-oxide superconducting wire.

In the eleventh aspect of invention of the present application, the filament is mainly composed of a Bi-based-oxide superconductor in which the ab-plane has high orientation ability. Hence, the invention can offer an oxide superconducting wire having an especially high critical current density.

More specifically, of the oxide superconductors, a Bi-based-oxide superconductor having a structure in which the ab-plane is oriented has an especially high critical current density. In the case of the Bi-based-oxide superconducting wire incorporating the invention, because the filaments are placed in the form of concentric circles as described above, even a round wire before being processed into the shape of a tape can obtain the worked structure described below. That is, the ab-planes of, for example, Bi-2212 (bismuth-based 2212 phases such as $Bi_2Sr_2Ca_1Cu_2O_{8-\delta}$ and $(Bi,Pb)_2Sr_2Ca_1Cu_2O_{8-\delta}$) and Bi-2201, both of which are precursors of Bi-2223, are oriented along the wide-width surface of the filament, as described above. The heat treatment of this round wire can obtain a structure in which the ab-plane of Bi-2223 is oriented along the wide-width surface of the filament. Consequently, the invention can offer an oxide superconducting wire having an especially high critical current density.

Advantageous Effects of Invention

The present invention can stably offer both a precursor wire of an oxide superconducting wire having high critical current density and by extension an oxide superconducting wire.

DESCRIPTION OF EMBODIMENTS

An explanation is given below to the embodiments of the present invention by referring to the drawings. The present invention is not limited to the embodiments described below. The embodiments described below can be modified variously within the scope identical or equivalent to the present invention. In the explanation below, for the sake of convenience, a monofilamentary segment having a cross section of a regular hexagon is referred to as a hexagonal monofilamentary segment, and a monofilamentary segment having a cross section of the shape of an arch is referred to as an arch-shaped monofilamentary segment.

(1) Structure of the Center Portion

First, an explanation is given to the structure of the center portion. Segments having various shapes and structures can be placed in the center portion. As the segment, it is desirable to use a monofilamentary segment having a filament made of a precursor of an oxide superconductor because a larger number of filaments can be placed to achieve a higher critical current density. Desirable examples are shown below.

(1-1) Structure in which One Monofilamentary Segment is Placed

Figure 1:
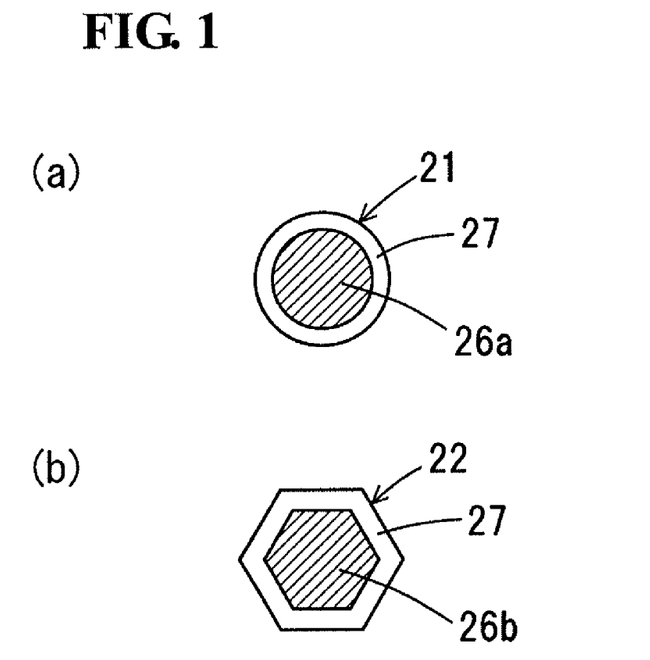
FIG. 1 illustrates cross-sectional views each showing an example of the structure of a monofilamentary segment to be placed in the center portion of a precursor wire of an oxide superconducting wire in an embodiment of the present invention.

Part (a) and Part (b) of FIG. 1 are cross-sectional views showing a circular monofilamentary segment 21 and a hexagonal monofilamentary segment 22, respectively, each of which is to be placed in the center portion of a precursor wire of an oxide superconducting wire in an embodiment of the present invention. The circular monofilamentary segment 21 and the hexagonal monofilamentary segment 22 have a filament 26a having a circular cross section and a filament 26b having a hexagonal cross section, respectively. Each of the filaments is composed mainly of a precursor of an oxide superconductor and covered with a second sheath 27 made of silver or silver alloy.

(1-2) Structure in which Six Monofilamentary Segments are Placed Close to One Another Around One Monofilamentary Segment One circular monofilamentary segment 21 shown in Part (a) of FIG. 1 or one hexagonal monofilamentary segment 22 shown in Part (b) of FIG. 1 is placed at the center, and six monofilamentary segments, which are identical with the monofilamentary segment placed at the center, are placed close to one another around the monofilamentary segment at the center to form the center portion.

(2) Structure of a Peripheral Segment

Figure 2:
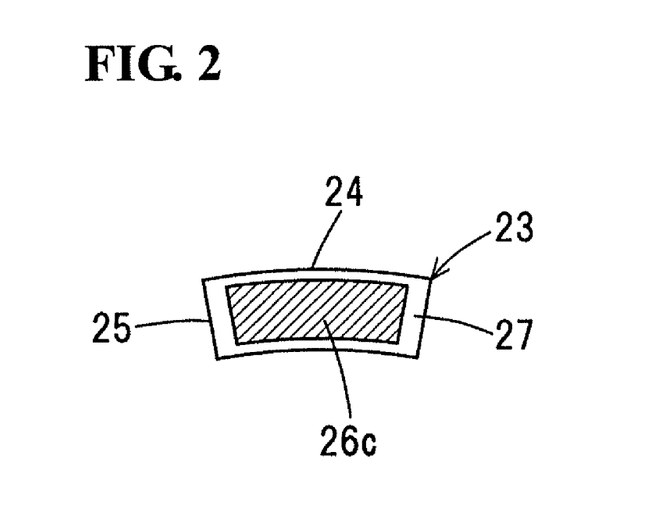
FIG. 2 is a cross-sectional view showing an example of the structure of a peripheral segment included in a precursor wire of an oxide superconducting wire in an embodiment of the present invention.

Arch-shaped monofilamentary segments are placed close to one another in the form of concentric circles at the peripheral portion surrounding the center portion. FIG. 2 is a cross-sectional view of a peripheral segment in an embodiment of the present invention. The peripheral segment is formed by covering a filament 26c, which is composed mainly of a precursor of an oxide superconductor and formed so as to have the shape of a ribbon through a rolling operation, with a second sheath made of silver or silver alloy. The peripheral segment is formed as an arch-shaped monofilamentary segment 23, in which two wide-width surfaces 24 each having the shape of an arch are positioned to face each other and side surfaces 25 each having the shape of a straight line are positioned next to the wide-width surfaces 24.

In the arch-shaped monofilamentary segment, the curvature of the wide-width surface and the width of the wide-width surface and side surface are determined as appropriate to a desirable value by considering the diameter of the center portion, the diameter of the precursor wire, the number of peripheral segments to be placed, and so on. It is desirable that the curvature of the wide-width surface and the angle of the straight line of the side surface forming with the wide-width surface be determined for individual positions to which the segment is placed by considering the magnitude of the radius of the circle at the time the segment is placed in the concentric circle and the like because this approach can further decrease the gap between the peripheral segments.

(3) Number of Layers of Segments and the Number of Segments

It is desirable that the total number of layers of segments, which is the summation of the number of layers of segments placed in the center portion and the number of layers of peripheral segments, be eight or more in order to increase the orientation ability of the crystal in the filament and to further increase the critical current density. It is desirable that the total number of segments be 100 or more.

(4) Structure of a Precursor Wire of an Oxide Superconducting Wire

Figure 3:
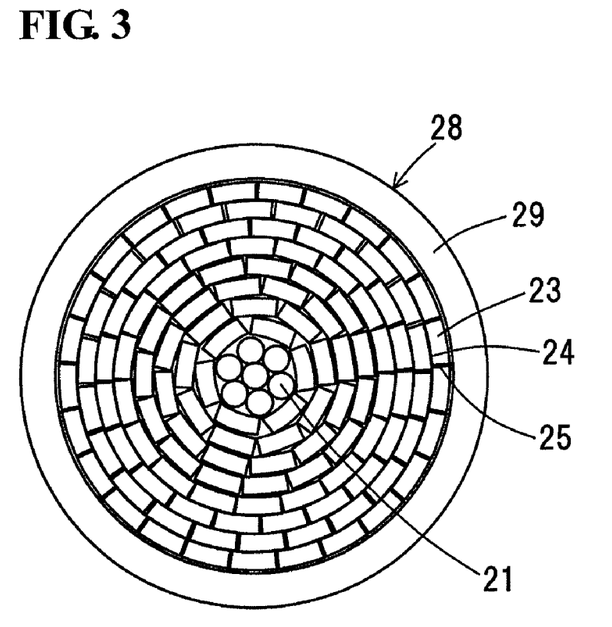
FIG. 3 is a cross-sectional view of a precursor wire of an oxide superconducting wire in an embodiment of the present invention.

Next, an explanation is given to the structure of a precursor wire of an oxide superconducting wire in an embodiment of the present invention. FIG. 3 is a cross-sectional view of a precursor wire 28 of a typical oxide superconducting wire in an embodiment of the present invention.

(4-1) Center Portion

As shown in FIG. 3, in the center portion, six circular monofilamentary segments 21 are placed such that they surround one circular monofilamentary segment at the center. The center portion has a cross section having a shape close to a regular hexagon.

(4-2) Peripheral Portion

In the peripheral portion, a plurality of peripheral segments, each of which is an arch-shaped monofilamentary segment 23, are placed in a multilayer state in the form of concentric circles such that side surfaces 25 of neighboring arch-shaped monofilamentary segments 23 are brought into contact with each other and wide-width surfaces 24 surround the center portion. In FIG. 3, to avoid the diagram from becoming complicated, the illustration of the filament is omitted.

(4-3) Placement of Filaments

Figure 4:
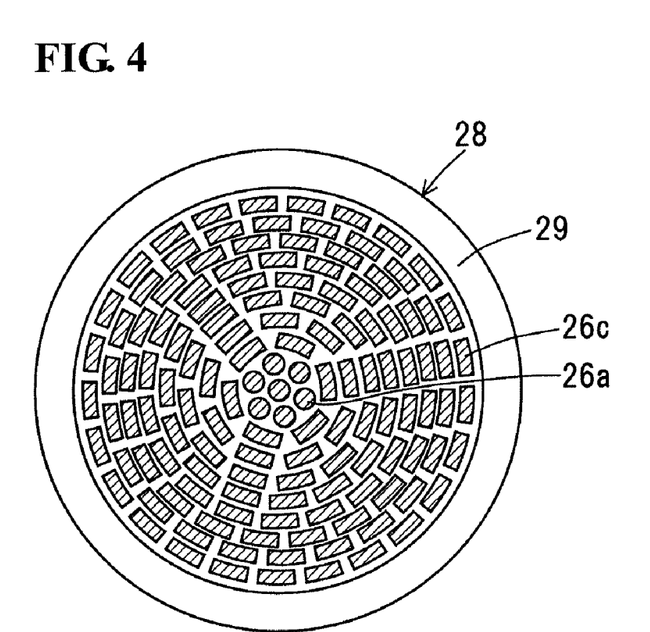
FIG. 4 is a cross-sectional view showing an example of the placement of filaments in a precursor wire of an oxide superconducting wire in an embodiment of the present invention.

FIG. 4 is a cross-sectional view showing the placement of filaments made of a precursor of an oxide superconductor in a cross section of the precursor wire of an oxide superconducting wire shown in FIG. 3. As shown in FIG. 4, a plurality of ribbon-shaped filaments 26c, each of which has arch-shaped wide-width surfaces, are placed in the form of concentric circles such that the wide-width surfaces surround the center portion.

(5) Production of a Segment, Precursor Wire, and Oxide Superconducting Wire (5-1) Production of a Monofilamentary Segment to be Placed in the Center Portion (a) Circular Monofilamentary Segment The circular monofilamentary segment can be produced through the method described below. The second sheath 27 having the shape of a circular tube and made of silver or silver alloy is prepared in a specified size. A powder composed mainly of a precursor of an oxide superconductor is prepared. More specifically, for example, $Br_2O_3$, PbO, $SrCO_3$, $CaCO_3$, and CuO are mixed with a ratio of Bi:Pb:Sr:Ca:Cu=1.7:0.3:1.9:2:3. The mixture is subjected to repeated heat treatment and pulverization to obtain the powder. The powder is filled in the second sheath 27 to form the filament 26a. The filament 26a is drawn to achieve a specified diameter. Thus, the circular monofilamentary segment 21 is produced.

(b) Hexagonal Monofilamentary Segment

As the monofilamentary segment to be placed in the center portion, in addition to the above-described circular monofilamentary segment, a hexagonal monofilamentary segment may also be used. The hexagonal monofilamentary segment 22 is produced by drawing, for example, the above-described circular monofilamentary segment 21 using a regular hexagonal die having specified dimensions.

(5-2) Production of a Peripheral Segment

A peripheral segment can be easily produced by processing a circular monofilamentary segment so as to have an arch-shaped cross section. More specifically, after the above-described circular monofilamentary segment 21 is rolled to a specified thickness, the rolled segment is drawn using a specially formed die having the shape of an arch with specified dimensions to complete the production.

(5-3) Production of a Precursor Wire

A precursor wire is produced as follows. First, at the inside of the first sheath having the shape of a circular tube, a plurality of peripheral segments are placed around the center portion in the form of concentric circles such that wide-width surfaces of the peripheral segments surround the center portion. Then, the first sheath is drawn to closely fit the peripheral segments.

More specifically, as shown in FIG. 3, in the first sheath 29 that has the shape of a circular tube, that is made of silver or silver alloy, and that has specified outer and inner diameters, seven circular monofilamentary segments 21 are placed such that six segments surround one segment at the center to form the center portion having a cross section close to a regular hexagon. Next, at the outside of the foregoing center portion, peripheral segments are placed such that the wide-width surfaces 24 of arch-shaped monofilamentary segments 23, which form the peripheral segments, surround the center portion. In other words, the arch-shaped monofilamentary segments 23 are brought into contact with one another to form a circle that surrounds the center portion. Subsequently, at the outside of the foregoing circle, other peripheral segments are placed so as to form a circle concentric with the foregoing circle. This procedure is repeated to place a plurality of peripheral segments by stacking them in layers in the form of concentric circles. Then, a drawing operation is performed to closely fit the multiple segments in the first sheath 29. Thus, the precursor wire 28 is produced.

(5-4) Production of an Oxide Superconducting Wire

The precursor wire 28 of an oxide superconducting wire produced as described above is further subjected to a drawing operation and then heat-treated under a specified condition to produce an oxide superconducting wire. In the precursor wire produced as described above, as shown in FIG. 3, a plurality of peripheral segments are placed in a multilayer state in the form of concentric circles under a closely arranged condition. In other words, as shown in FIG. 4, the ribbon-shaped filaments 26c are placed in the form of concentric circles such that the wide-width surfaces surround the center portion. Consequently, at the time the precursor wire is drawn to reduce the diameter, the stress is uniformly applied to the wide-width surfaces of the filaments 26c. As a result, the oxide superconducting wire is formed in which not only is the orientation ability of the crystal of the oxide superconductor's precursor forming the filament 26c increased but also the second sheath 27 is suppressed from developing breakage.

It is desirable that in the drawing operation of the precursor wire of an oxide superconducting wire, the precursor wire of an oxide superconducting wire be drawn so as to have a cross section of an isotropic shape such as a circle or hexagon with a specified dimension. In addition, after performing the drawing operation, a rolling operation can also be performed to produce a tape-shaped wire or a rectangular wire that has a cross section somewhere between a tape and a circle. These tape-shaped wire and rectangular wire have a larger anisotropy in the critical current density and AC loss with respect to an external magnetic field than that of a circular wire. Nevertheless, the processing from a round wire to a rectangular wire through a rolling operation can increase the density of the powder, thereby increasing the critical current density.

EXAMPLES

The present invention is explained below in further detail based on examples.

Example

This example placed one monofilamentary segment having a circular cross section in the center portion and around it, placed 112 peripheral segments each having an arch-shaped cross section in the form of nine layers of concentric circles, that is, in total, 113 segments in 10 layers.

1. Production of an Oxide Superconducting Wire
(1) Production of a Peripheral Segment
(1-1) Production of a Circular Monofilamentary Segment $Br_2O_3$, PbO, $SrCO_3$, $CaCO_3$, and CuO were mixed with a ratio of Bi:Pb:Sr:Ca:Cu=1.7:0.3:1.9:2:3. The mixture was subjected to repeated heat treatment and pulverization to obtain a powder. The powder was filled in a second sheath having an outer diameter of 46 mm and an inner diameter of 43 mm to form a filament. The filament was drawn to achieve a diameter of 3 mm. Thus, a circular monofilamentary segment was produced.

(1-2) Processing to the Shape of an Arch

The obtained circular monofilamentary segment was processed so as to have four types of arch-shaped cross sections each having a width of wide-width surface of 4.1 to 4.5 mm with a different curvature. Thus, peripheral segments each having a ribbon-shaped filament were produced.

(2) Production of a Precursor Wire
(2-1) Placement of Segments

Around a center segment having a circular cross section with an outer diameter of 3 mm, 112 peripheral segments described above were placed in the form of concentric circles such that the number of layers of the total segments including the center segment became 10. The placed segments were inserted into a first sheath made of silver and having an outer diameter of 36 mm and an inner diameter of 31 mm.

(2-2) Drawing

Next, a drawing operation was performed such that the first sheath had a diameter of 1.6 mm. After the drawing, a part of the wire was cut to observe the configuration in the cross section.

(2-3) Rolling

The drawn wire was further subjected to a rolling operation to produce a precursor wire having a width of 4.2 mm and a thickness of 0.23 mm. A part of the obtained precursor wire was cut to observe the configuration in the cross section.

Figure 10:
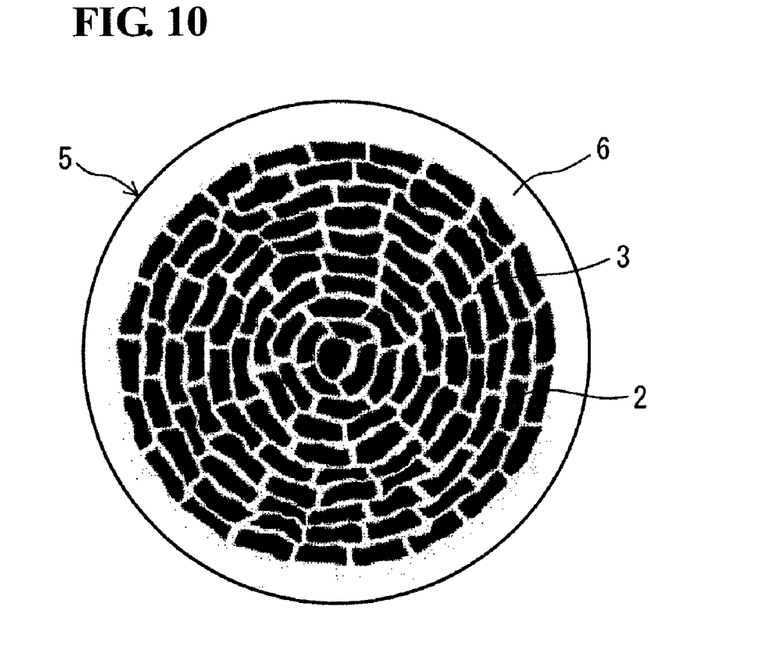
FIG. 10 is a diagram showing the configuration in a cross section of the oxide superconducting wire in Example 1 after the wire is drawn.

2. Result of the Observation of the Cross Section of the Precursor Wire
(1) After the Drawing FIG. 10 is a diagram showing the configuration in the cross section of the wire after the drawing in this example. As can be seen from FIG. 10, the wire after the drawing keeps the segments in shape, the segments are configured in the form of concentric circles in a state where the arch shape of the cross section is maintained, and the second sheath is free from breakage.

(2) After the Rolling

Figure 11:
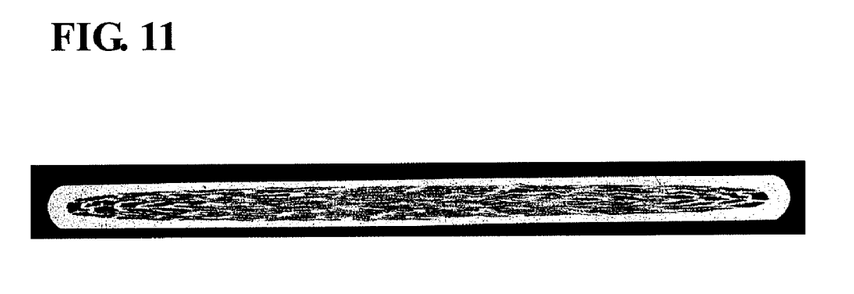
FIG. 11 is a microscope photograph of a cross section of the precursor wire in Example 1.

FIG. 11 is a microscope photograph of the cross section of the precursor wire in this example. As can be seen from FIG. 11, the individual filaments have a uniform thickness.

3. Production of an Oxide Superconducting Wire and Measurement of Jc

Next, the precursor wire was heat-treated at 830° C. for 20 hours in a pressurized atmosphere having an oxygen partial pressure of 8 kPa. Then, an intermediate rolling operation was performed, and again heat treatment was performed at 830° C. for 30 hours in a pressurized atmosphere having an oxygen partial pressure of 8 kPa. Thus, an oxide superconducting wire was produced. The produced oxide superconducting wire was cooled to a temperature of liquid nitrogen to measure its Jc. The measured result is shown in Table I and FIG. 15.

Comparative Examples 1 to 4

Comparative examples 1 to 4 placed peripheral segments each having a regular hexagonal cross section in the form of a honeycomb. After a drawing operation, a rolling operation was performed through the same method as that of Example to form a precursor wire. Then, heat treatment was performed to produce an oxide superconducting wire.

1. Production of an Oxide Superconducting Wire
1-1. Production of Peripheral Segments and a Center Segment The same type of segment was used for both the peripheral segment and center segment. A powder having the same composition as that of the powder used in Example was filled into a second sheath having a specified diameter to form a filament. The filament was drawn to produce a circular monofilamentary segment. Comparative examples 1 to 4 were each processed so as to have a regular-hexagonal cross section with a specified size so that all the segments shown in Table I could be housed. Thus, the peripheral segments and the center segment were produced.

1-2. Production of a Precursor Wire

Next, the peripheral segments were placed in the form of a honeycomb around one center segment so that the number of all segments could coincide with the number shown in Table I. The segments were inserted into a first sheath having the same size as in Example. A drawing operation was performed such that the first sheath had the same diameter as that of Example. After the drawing operation, a rolling operation was performed to produce a precursor wire. Observation of the cross section was conducted on the wires after the drawing for Comparative examples 3 and 4 and on the precursor wire after the rolling for Comparative example 3.

Figure 12:
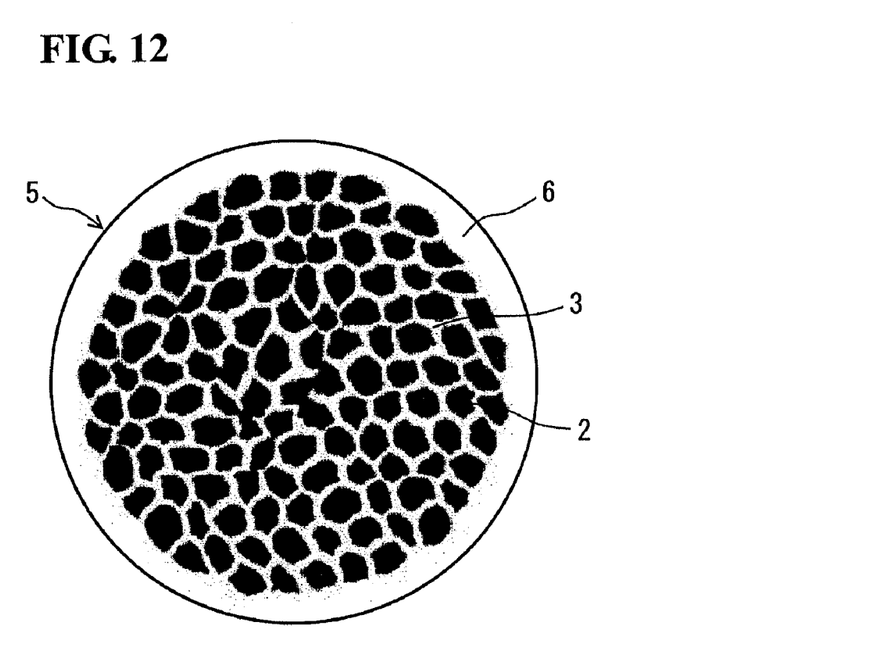
FIG. 12 is a diagram showing the configuration in a cross section of the wire in Comparative example 3 after the wire is drawn.

2. Result of the Observation of the Cross Section of the Precursor Wire
(1) After the Drawing FIGS. 12 and 13 are diagrams showing the configuration in the cross sections of the wires after the drawing in Comparative examples 3 and 4, respectively. As can be seen from FIGS. 12 and 13, in the case of Comparative examples 3 and 4, some of the second sheaths of the wire after the drawing develop breakage, creating bridging.

(2) After the Rolling

Figure 14:
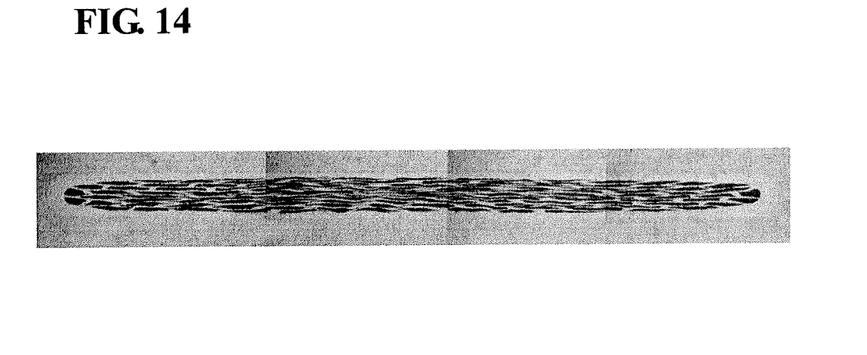
FIG. 14 is a microscope photograph of a cross section of the precursor wire in Comparative example 3.

FIG. 14 is a microscope photograph of a cross section of the precursor wire in Comparative example 3. As can be seen from FIG. 14, in the case of Comparative example 3, the thickness of the filament of the precursor wire after the rolling is not uniform even in the center portion in the width direction.

3. Production of Oxide Superconducting Wires and Measurement of Jc

Next, the precursor wires of Comparative examples 1 to 4 were heat-treated under the same condition as used in Example to produce oxide superconducting wires. Then, their Jc was measured. The measured results are shown in Table I and FIG. 15 together with the measured result of Example.

TABLE I

| | Number of layers | Number of all segments | Configuration | Width (mm) | Thickness (mm) | Jc (A/mm2) |
|---|---|---|---|---|---|---|
| Example | 10 | 113 | Comparative circles | 4.2 | 0.23 | 630 |
| Comparative example 1 | 4 | 37 | Honeycomb | 4.2 | 0.23 | 379 |
| Comparative example 2 | 5 | 55 | Honeycomb | 4.2 | 0.23 | 432 |
| Comparative example 3 | 7 | 121 | Honeycomb | 4.2 | 0.23 | 486 |
| Comparative example 4 | 9 | 211 | Honeycomb | 4.2 | 0.23 | 484 |

As can be seen from Table I, the oxide superconducting wire of Example has a higher Jc than that of the oxide superconducting wires of Comparative examples 1 to 4. The reason why the oxide superconducting wire of Example has a high Jc as described above is attributable to the fact described below. Because the peripheral segments each have an arch-shaped cross section and placed in the form of concentric circles, when the diameter-reducing operation is performed, the diameter is reduced while the peripheral segments are precisely maintaining the configuration in the cross section of concentric circles without losing their shape. As a result, a uniform stress is applied to the wide-width surfaces of the ribbon-shaped filaments placed so as to surround the center portion. This uniform stress application improves the orientation ability of the crystal of the oxide superconductor.

Figure 15:
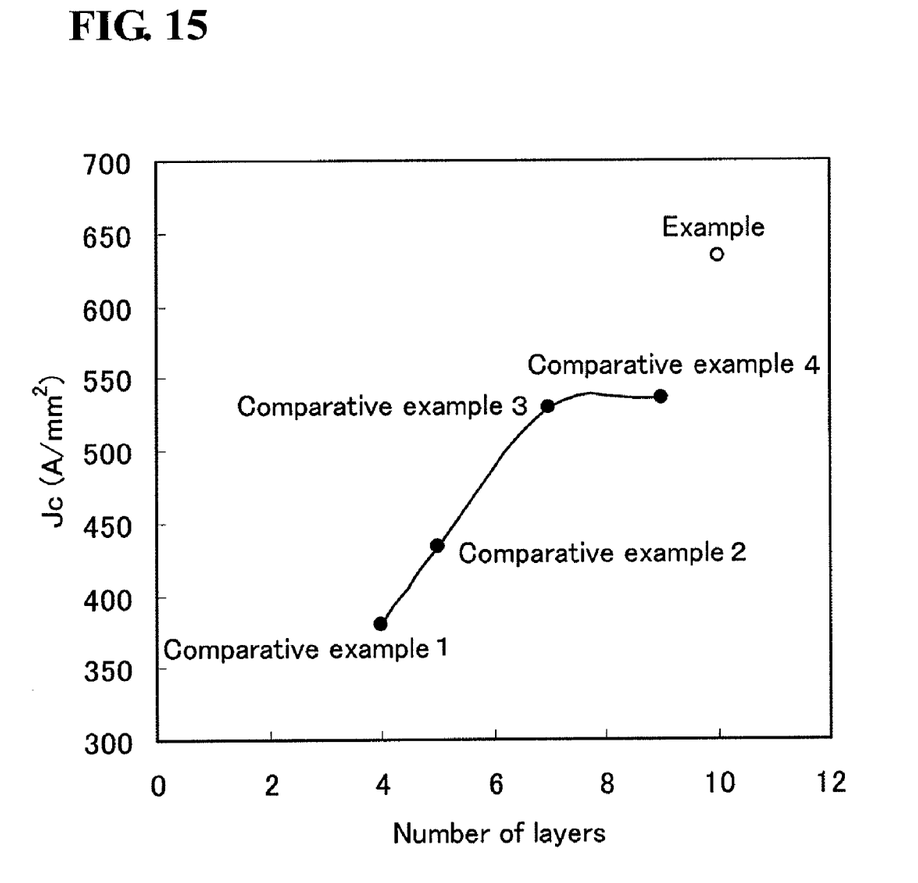
FIG. 15 is a graph showing the measured results of the critical current densities (Jc) of the oxide superconducting wires in Example and Comparative examples.

In addition, as can be seen from FIG. 15, in the case of Comparative examples, when the number of layers of all segments, which include the center segment and peripheral segments, exceeds six, even when the number of layers increases, the Jc does not increase. The reason for this is attributable to the fact that in the case of Comparative examples, the number of places of bridging between peripheral segments increases resulting from the processing for diameter reduction. In contrast, in the case of Example, because the bridging is suppressed from developing, the Jc increases significantly.

As explained above, the present invention can offer an excellent oxide superconducting wire having high Jc.

| Reference Signs List | |
|---|---|
| 2, 2', 26a, 26b, and 26c: | filament |
| 3 and 27: | second sheath |
| 5 and 28: | precursor wire |
| 6 and 29: | first sheath |
| 14: | round monofilamentary wire |
| 15: | hexagonal monofilamentary wire |
| 16: | rectangular monofilamentary wire |
| 21: | circular monofilamentary segment |
| 22: | hexagonal monofilamentary segment |
| 23: | arch-shaped monofilamentary segment |
| 24: | wide-width surface |
| 25: | side surface |

The invention claimed is:

1. A precursor wire of an oxide superconducting wire, the precursor wire comprising:
   (a) a first sheath made of silver or silver alloy;
   (b) a center portion placed at the inside of the first sheath; and
   (c) a plurality of peripheral segments placed close to one another at the inside of the first sheath so as to surround the center portion;
   in the center portion, a monofilamentary segment being placed, the monofilamentary segment having a circular or regular hexagonal cross section and comprising a filament made of a precursor of an oxide superconductor and covered with a second sheath made of silver or silver alloy;
   each of the multiple peripheral segments being formed as a monofilamentary segment that has an arch-shaped cross section and that comprises a ribbon-shaped filament made of a precursor of an oxide superconductor and covered with a second sheath made of silver or silver alloy;
   the multiple peripheral segments being placed in a multilayer state in the form of concentric circles such that wide-width surfaces of the peripheral segments surround the center portion.

2. The precursor wire of an oxide superconducting wire as defined by claim 1, wherein in the center portion, seven monofilamentary segments are placed each of which has a circular or regular hexagonal cross section and each of which comprises a filament made of a precursor of an oxide superconductor and covered with a second sheath made of silver or silver alloy, the seven monofilamentary segments being configured such that six monofilamentary segments are placed close to one another around one monofilamentary segment.

3. The precursor wire of an oxide superconducting wire as defined by claim 1, wherein the number of layers of all segments is eight or more, the all segments being composed of the segment or the segments placed in the center portion and the peripheral segments placed in a multilayer state in the form of concentric circles.

4. The precursor wire of an oxide superconducting wire as defined by claim 1, wherein the total number of segments is 100 or more.

5. A method of producing the precursor wire of an oxide superconducting wire as defined by claim 1, the method comprising:
   (a) a peripheral segment-producing step for producing a peripheral segment formed as a monofilamentary segment that has an arch-shaped cross section and that comprises a ribbon-shaped filament made of a precursor of an oxide superconductor and covered with a second sheath made of silver or silver alloy;
   (b) a central monofilamentary segment-placing step for placing in the center portion a monofilamentary segment that has a circular or regular hexagonal cross section and that comprises a filament made of a precursor of an oxide superconductor and covered with a second sheath made of silver or silver alloy;
   (c) a peripheral segment-placing step for placing, in a first sheath made of silver or silver alloy, a plurality of peripheral segments described above around a center portion in a multilayer state in the form of concentric circles such that the wide-width surfaces surround the center portion; and (d) a peripheral segment-fitting step for closely fitting the multiple peripheral segments by drawing the first sheath.

6. The method of producing the precursor wire of an oxide superconducting wire as defined by claim 5, wherein the peripheral segment-producing step comprises:

(a) a circular monofilamentary segment-producing step for producing a circular monofilamentary segment that has a circular cross section and that comprises a filament made of a precursor of an oxide superconductor and covered with a second sheath made of silver or silver alloy;

(b) a rolling step for rolling the circular monofilamentary segment produced in the circular monofilamentary segment-producing step; and (c) a drawing step for drawing the circular monofilamentary segment rolled in the rolling step by using a specially formed die having a specified shape to obtain an arch-shaped cross section.

7. An oxide superconducting wire, being produced by drawing the precursor wire of an oxide superconducting wire as defined by claim 1 and then by heat-treating the drawn precursor wire.

8. The oxide superconducting wire as defined by claim 7, being produced by drawing the precursor wire of an oxide superconducting wire such that the precursor wire is formed so as to have a cross section of an isotropic shape and then by heat-treating the drawn precursor wire.

9. The oxide superconducting wire as defined by claim 7, being produced by drawing the precursor wire of an oxide superconducting wire, then by rolling the drawn precursor wire such that it has the shape of a tape, and then by heat-treating the rolled precursor wire.

10. The oxide superconducting wire as defined by claim 7, being a Bi-based-oxide superconducting wire.

11. The precursor wire of an oxide superconducting wire as defined by claim 2, wherein the number of layers of all segments is eight or more, the all segments being composed of the segment or the segments placed in the center portion and the peripheral segments placed in a multilayer state in the form of concentric circles.

12. The precursor wire of an oxide superconducting wire as defined by claim 2, wherein the total number of segments is 100 or more.

13. The precursor wire of an oxide superconducting wire as defined by claim 3, wherein the total number of segments is 100 or more.

14. The precursor wire of an oxide superconducting wire as defined by claim 11, wherein the total number of segments is 100 or more.

* * * * *